United States Patent [19]

Lin

[11] Patent Number: 4,519,015

[45] Date of Patent: May 21, 1985

[54] PLUG-IN TYPE OF POWER SUPPLY

[76] Inventor: Jiing S. Lin, 15, Lane 62, Tsai Kung I Rd., Tsoying, Kaohsiung, R.O.C., Taiwan

[21] Appl. No.: 525,766

[22] Filed: Aug. 23, 1983

[51] Int. Cl.³ .............................................. H05K 5/06
[52] U.S. Cl. ..................................... 361/399; 336/92; 336/107; 336/192
[58] Field of Search ............... 174/84 C, 52 PE; 336/92, 107, 192; 307/150, 151; 363/144, 146; 361/331, 380, 386, 395, 399, 400

[56] References Cited

U.S. PATENT DOCUMENTS

| | | | |
|---|---|---|---|
| 3,403,366 | 9/1968 | Klatte et al. | 336/92 |
| 3,711,806 | 1/1973 | Flentge | 336/107 |
| 4,012,672 | 3/1977 | Douglass et al. | 336/92 |
| 4,028,654 | 6/1977 | Bullard et al. | 336/92 |
| 4,039,900 | 8/1977 | Roback et al. | 361/388 |
| 4,107,636 | 8/1979 | DiGirolamo | 336/92 |
| 4,246,636 | 1/1981 | Kawamura et al. | 363/146 |
| 4,442,316 | 4/1984 | Thuermer | 174/84 C |

Primary Examiner—G. P. Tolin
Assistant Examiner—Gregory D. Thompson
Attorney, Agent, or Firm—Karl W. Flocks; Sheridan Neimark; A. Fred Starobin

[57] ABSTRACT

A plug-in type of power supply, as an improvement of regular power supply units, specifically a separate structure of the transformer apart from the frame shell, structured to have the terminals on the output side of the transformer plugged into the circuit board so as to achieve in coupling with the power plunger provided on the bottom lid of the frame shell by means of a joint piece made of phosphoric copper, thus sealing up the frame shell, the transformer and the circuit board in the meantime being secured in the frame shell to become a finished power supply unit, the structure of such a power supply unit designed as such through straight-in plunge-in plugging thereby simplifying assemblage and facilitating replacement of parts during assemblage processing, and quality control running as well, thus serving to reduce failure and rejection rates of the products and to aid in automatic mass production by virtue of such piecewise assemblage processings.

3 Claims, 2 Drawing Figures

PLUG-IN TYPE OF POWER SUPPLY

BACKGROUND OF THE INVENTION

The invention provides for a specially designed, but simply structured, easy to assemble, labour and time saving, low-cost, plug-in assembly type of power supply unit.

A review of conventional power supply units will give the fact that the connection of components such as winding coil for the transformer thereof, with others such as power input, and the control circuit board is unexceptionally achieved by soldering of leads. That the transformer is soldered to external elements by leads will call for a lot of labour and time, and it is not compatible for automatic production. To account for the assembly processing in the conventional mode, the circuit board will have to be soldered to the output terminal of the transformer before the lead from the input end of the transformer is soldered to the power plugs on the bottom lid. While the input lead of the transformer is being soldered, the transformer, circuit board and outgoing wire from the power supply are all trailing behind in a very limited space where lead positioning and soldering will have to be done all at once. That is quite an inconvenience indeed, in addition, as the soldering progresses, refuse projections and remains of metallic residues will be left in the frame case to produce hidden incidents such as shorts or unwanted signals that will have a very strong negative effect on the next stage of instrument or implement. In addition, in cases where a high temperature soldering gun is used, damage will be easily done to the plastic housing case by careless operation. These will all contribute to a high rate of failure or rejections due to poor workmanship in the assembly procedure, causing trouble for the quality control inspectors and an increase in production costs.

SUMMARY OF THE INVENTION

So the primary object of the present invention is to provide, in view of the many drawbacks and shortcomings found with the manufacturing of conventional power supply units as cited in the foregoing, a newly structured, simple to assemble, low-cost, power supply of a plug-in type of assembly.

A further object of the present invention is to provide a power supply of a plug-in type of assembly, specifically such an arrangement that the transformer and the power plugs are separately structured as two individual sections such that the input terminal of the transformer is to be inserted straight into a joint piece made of phosphoric copper for an embodiment characterized by the utilization of the elasticity of such a phosphoric copper joint piece to achieve in the union of the input terminals of the transformer with the plug or termed as the plug-in base, of the power supply unit, thereby achieving the removal of the trouble of soldering to join the input end of the transformer and the plug-in base of the power supply, thus offering a great convenience in the assembly procedure and a minimization of failure or rejection rates of products.

Still another object of the present invention is to provide a plug-in type of power supply characterized by the use of a plug-in base to replace leads to secure a straight plug-in type assembly to make a finished power supply unit that is compatible for automatic mass production with a substantial saving of lead materials, and by permitting the replacing of the circuit board so as to make it possible to use different types of circuit boards when deemed necessary, compatible for an automatic mass production concurrent with a substantial saving of material costs, production costs, and storage costs.

DETAILED DESCRIPTION

Figure 1:
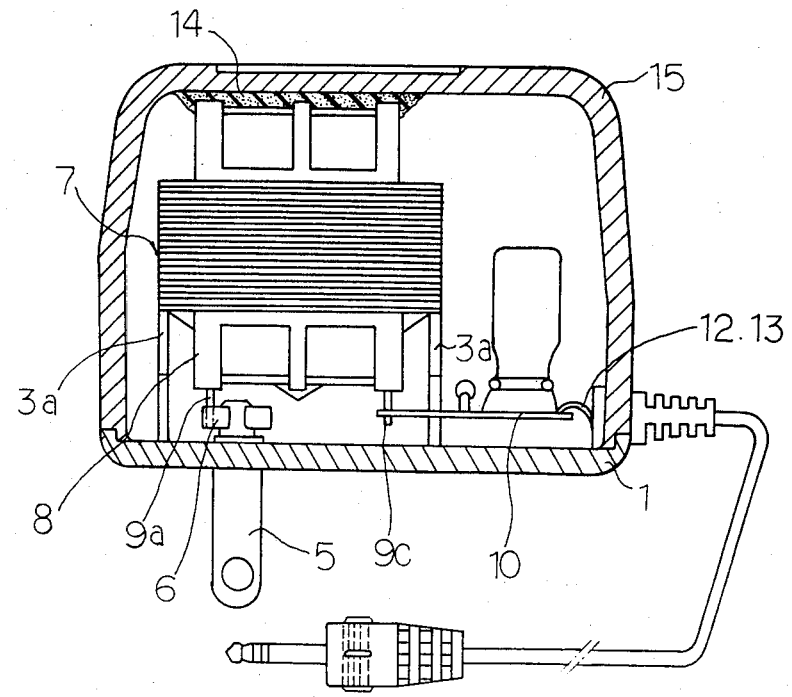
FIG. 1 is a cross section perspective of the plug-in type of power supply as covered by the present invention.
Figure 2:
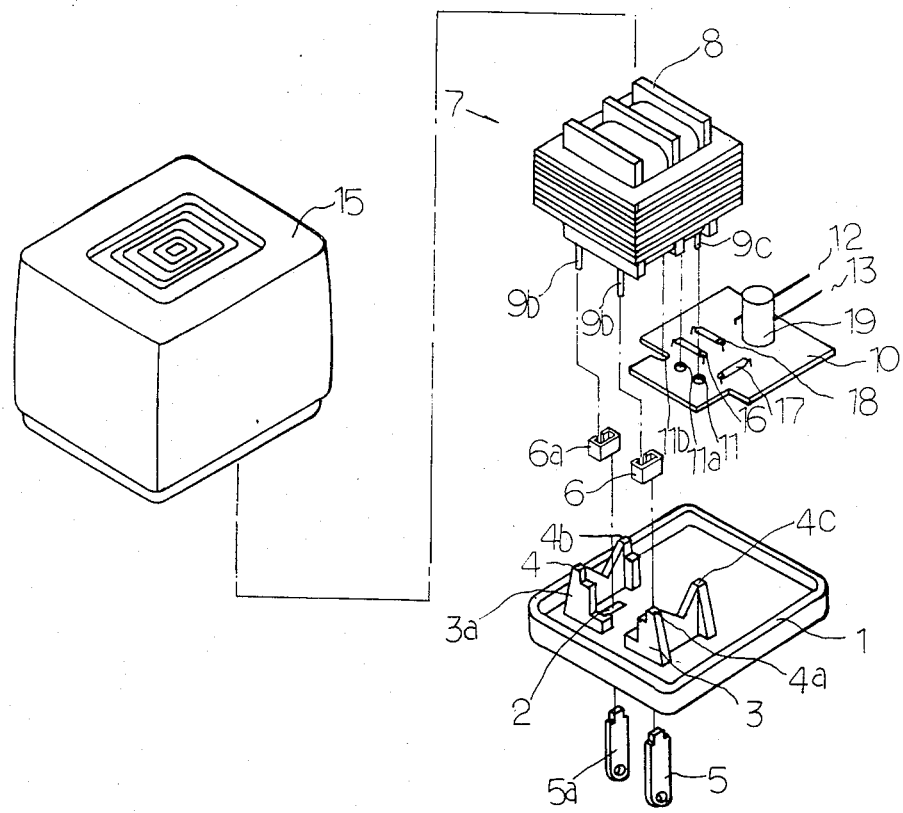
FIG. 2 is an analytical perspective of the plug-in type of power supply, in a three-dimensional setting, as covered by the present invention.

Referring to FIGS. 1 and 2 it is seen that the present invention is chiefly composed of a bottom lid 1, two power insertion plug prongs 5, 5a, a transformer coil device 7, a circuit board 10 and an upper lid 15 to seal up the unit together with bottom lid 1.

On the surface of the bottom lid 1 there are provided two rectangular slots 2, one of which is seen in the drawing but the location of the other being indicated to accomodate the setting of two pairs of power plug prongs 5, 5a extending outside the frame shell. On top of such power plug prongs 5, 5a there are attached two phosphoric copper joint pieces 6, 6a to accommodate engagement by the input plug prongs 9a, 9b from the transformer coil device 7.

The transformer coil device 7 is housed in a framework stack of metal pieces covering a shaft member 8 for the winding coils within. For the shaft member 8 there are provided three output insertion prongs 9c, only one of which is shown in the drawing, as the output terminals of the transformer for insertion into the round holes 11, 11a, 11b as provided on the circuit board 10. Contact therebetween will set the coil device 7 and the circuit board 10 to connect electrically, so that the holes 11, 11a, 11b may let pass the power current into the electronic elements 16, 17, 18, 19, on the circuit board 10, and the power current will then finally find an outlet via leads 12, 13 for output for use for externally provided facilities. With the transformer coil device 7 united with circuit board 10, the power input plug prongs 9a, 9b of the shaft member 8 will then be engaged to two curved phosphoric copper joint pieces 6, 6a which are attached to the power plug prongs 5, 5a. To follow that, the lower end of the transformer core will be thrust against the top surfaces 4, 4a, 4b, 4c, lying over the edges of plane-shaped protruding pieces 3, 3a as provided on the bottom lid 1, whereupon a firm fitting will be secured. In addition, a sponge 14 is to be installed over the transformer coil device 7 in order that the interior parts may remain free from dislocation once the upper lid 15 is sealed to bottom lid 1 so as to enhance reliability and convenience in use.

The plug-in type of power supply unit according to the invention is brand new in structure, easy to assemble, will save a lot of time and labour in the production runs, and will accommodate automated mass production by departmentalized processing arrangements that will promote product reliability and minimize production costs.

I claim:
1. A plug-in type of power supply comprising
   a casing including a bottom lid and an upper lid in sealing connection therewith,
   said bottom lid having openings therethrough, support means mounted on said bottom lid,
a transformer coil section and a circuit board both mounted on said support means,
said transformer coil section having shaft members extending therethrough,
said shaft members having input plug prongs and output insertion prongs mounted on and electrically connected to said shaft members,
power plug prongs extending through said openings in said bottom lid,
conductive metal joint pieces engaged on said power plug prongs,
said input plug prongs extending into said joint pieces,
said circuit board having holes therethrough to receive said output insertion prongs therein for rigid connection of said transformer coil section with said circuit board,
output means connected from said circuit board through said casing,
said transformer coil section and said circuit board in rigid connection to each other and to said upper and bottom lids.

2. The plug-in type of power supply according to claim 1, further characterized by
said support means including
plane-shaped pieces mounted on said bottom lid and extending vertically therefrom and having flat top edge surfaces,
said transformer coil section supported pressed against said flat top edge surfaces,
a sponge means mounted in a pressed fit between the inside of said upper lid and an upper portion of said transformer coil section,
whereby all parts of the power supply are held in firm electrical connection to each other and firmly held relative to said upper and bottom lids of said casing.

3. The plug-in type of power supply according to claim 1, further characterized by
said transformer coil section positioned over said support means,
said circuit board mounted to connect to said output insertion prongs and extend over a periphery of said support means in cantilevered relation to said support means.

* * * * *